United States Patent
Lin

(10) Patent No.: US 8,410,362 B1
(45) Date of Patent: Apr. 2, 2013

(54) FIXING STRUCTURE FOR THE FACEPLATE VENTILATION SCREEN OF A POWER SOURCE SUPPLIER

(75) Inventor: Mu-Chun Lin, Taichung (TW)

(73) Assignee: Chyng Hong Electronic Co., Taichung (TW)

( * ) Notice: Subject to any disclaimer, the term of this patent is extended or adjusted under 35 U.S.C. 154(b) by 43 days.

(21) Appl. No.: 13/287,332

(22) Filed: Nov. 2, 2011

(51) Int. Cl.
*H02G 3/14* (2006.01)

(52) U.S. Cl. ........... 174/66; 174/67; 174/72 A; 439/135; D8/353; D13/177

(58) Field of Classification Search ............ 174/66, 174/67; 220/241, 242; 439/135, 136; D8/353; D17/177
See application file for complete search history.

(56) References Cited

U.S. PATENT DOCUMENTS

| | | | | |
|---|---|---|---|---|
| 5,811,730 A | * | 9/1998 | Rintz | 174/66 |
| 6,070,637 A | * | 6/2000 | Jancan | 160/40 |
| 8,183,460 B2 | * | 5/2012 | Williams | 174/68.1 |

* cited by examiner

*Primary Examiner* — Dhirubhai R Patel
(74) *Attorney, Agent, or Firm* — Ming Chow; Sinorica, LLC

(57) ABSTRACT

A fixing structure for the faceplate ventilation screen of a power source supplier includes a faceplate body and at least one ventilation screen. The faceplate body has an inner side formed with at least two first extension portions protruding out vertically in the same direction, and the two first extension portions have their opposite inner sides respectively provided with a first position-limiting member extending oppositely at a location adjacent to the faceplate body. The first position-limiting members are parallel to the faceplate body, and a first gap is formed between the first position-limiting members and the faceplate body for receiving two ends of the ventilation screen. The first position-limiting members can be deformed by external force toward the faceplate body for firmly fixing the ventilation screen on the faceplate body.

2 Claims, 8 Drawing Sheets

FIXING STRUCTURE FOR THE FACEPLATE VENTILATION SCREEN OF A POWER SOURCE SUPPLIER

BACKGROUND OF THE INVENTION

1. Field of the Invention

This invention relates to a fixing structure, particularly to one for the faceplate ventilation screen of a power source supplier.

2. Description of the Prior Art

In general, when a power source supplier carries out AC and DC power source conversion, operation of the electronic parts in the power source supplier will produce high temperature. To prevent the electronic parts of a power source supplier from damaged by excessively high temperature produced in the power source supplier, the power source supplier has its interior installed with cooling fins and heat-dissipating fans and its peripheral side bored with at least one opening assembled thereon with a ventilation screen for exhausting high temperature out of the power source supplier through circulation, able to enhance effect of heat dissipation for the power source supplier. The ventilation screen of a conventional power source supplier is threadably locked on the casing or on the faceplate of the power source supplier; therefore, the casing and the ventilation screen of the power source supplier must be bored with a plurality of locking holes so that the ventilation screen can be firmly fixed on the casing of the power source supplier by means of locking members, thus spoiling esthetic appearance of a power source supplier and complicated in installation of the ventilation screen.

SUMMARY OF THE INVENTION

The objective of this invention is to offer a fixing structure for the faceplate ventilation screen of a power source supplier, facilitating a user to simplify a process of installing a ventilation screen and having effect of beautifying the external looks of a power source supplier.

The fixing structure for the faceplate ventilation screen of a power source supplier includes a faceplate body and at least one ventilation screen. The faceplate has an inner side formed with at least two first extension portions protruding out vertically in the same direction, and the first extension portions have their opposite inner sides respectively provided with a first position-limiting member extending oppositely at a location adjacent to the faceplate body. The first position-limiting members are parallel to the faceplate body, and a reserved first gap is formed between the position-limiting members and the faceplate body for receiving two ends of the ventilation screen.

Thus, the first position-limiting members can be deformed by external force toward the faceplate body for firmly fixing the ventilation screen on the faceplate body, enabling a user to simplify the process of installing the ventilation screen and attaining effect of beautifying the external looks of a power source supplier.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
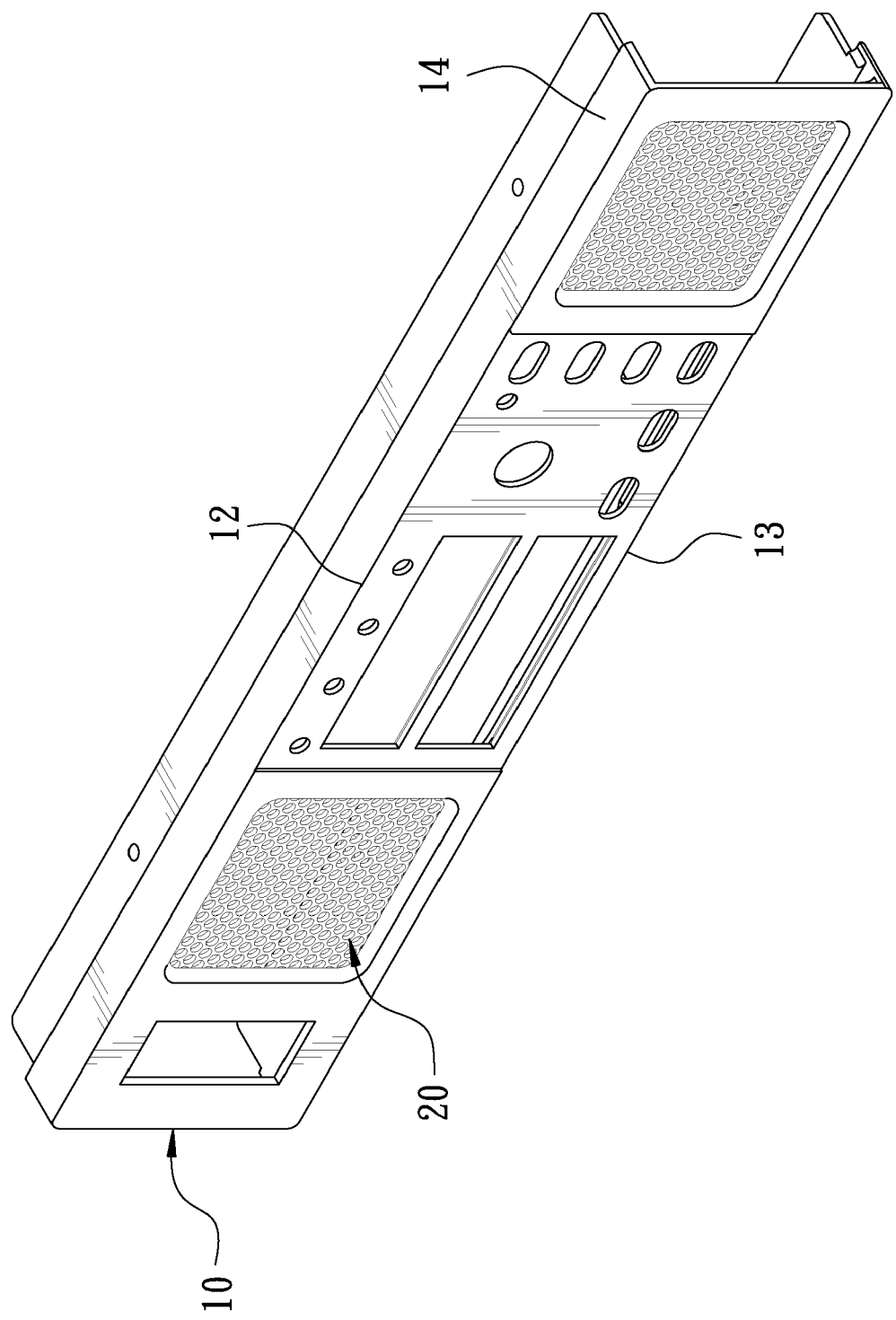
FIG. 1 is a perspective view of a first preferred embodiment of a fixing structure for the faceplate ventilation screen of a power source supplier in the present invention.
Figure 2:
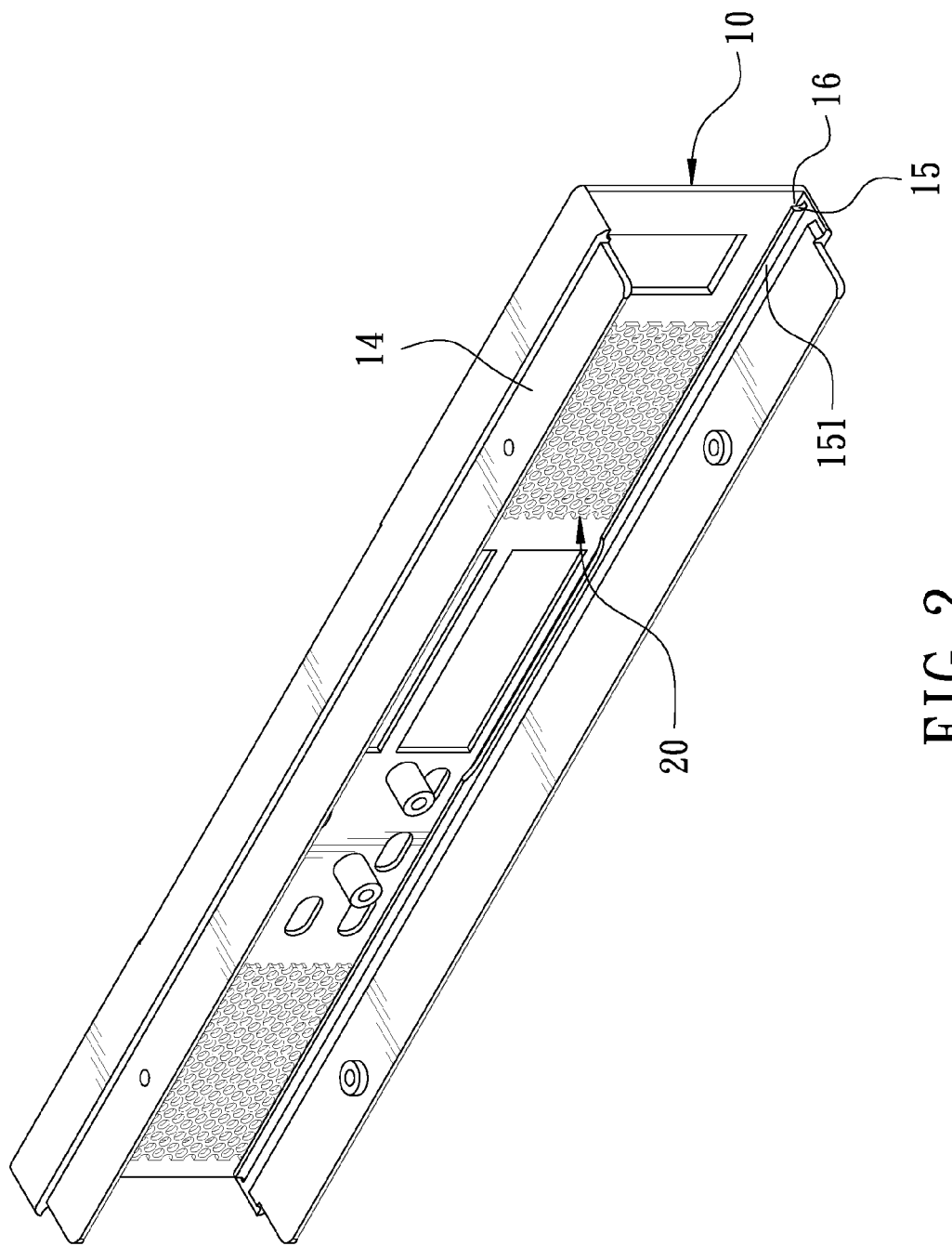
FIG. 2 is another perspective view of the first preferred embodiment of the fixing structure for the faceplate ventilation screen of a power source supplier in the present invention.
Figure 3:
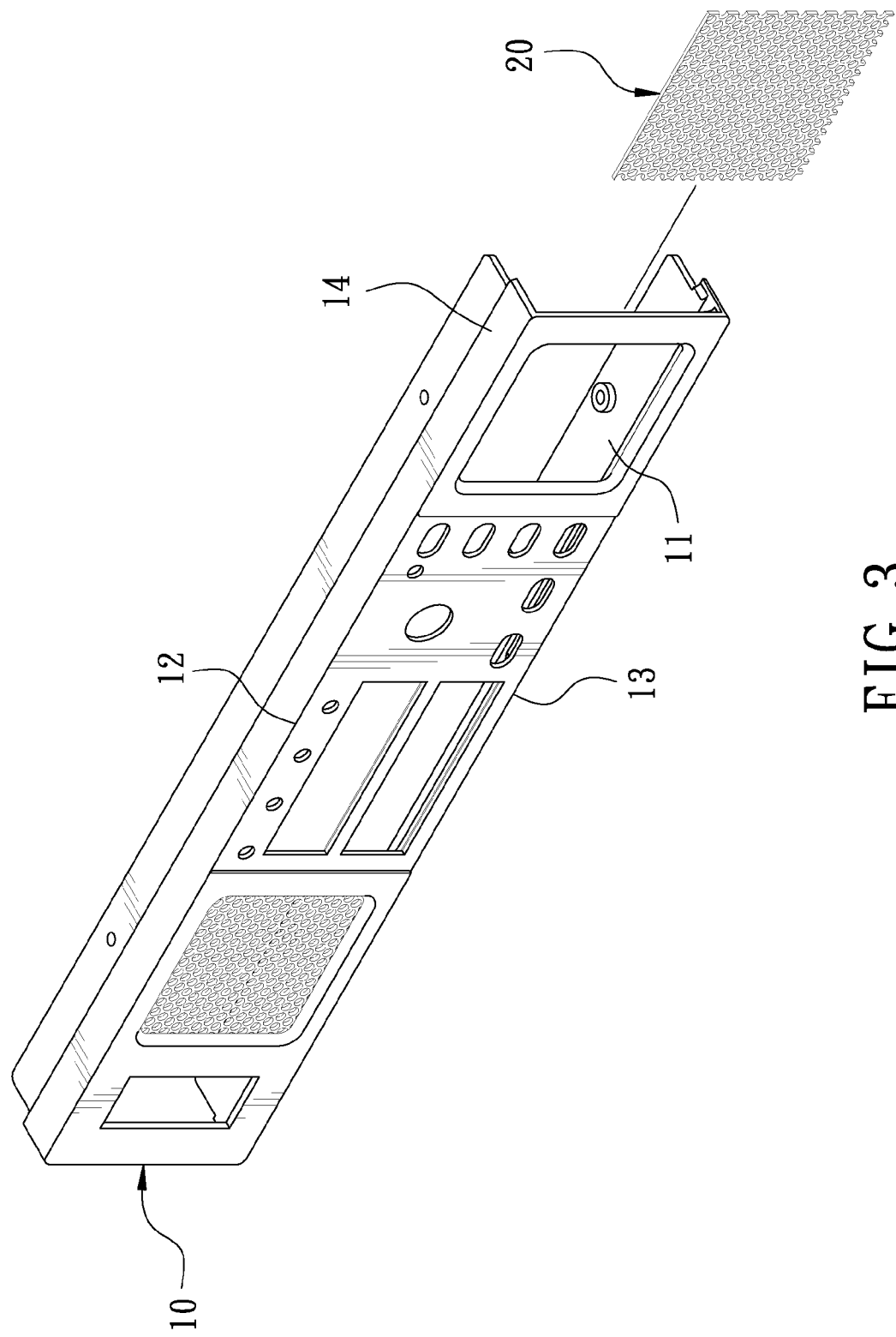
FIG. 3 is an exploded perspective view of the first preferred embodiment of the fixing structure for the faceplate ventilation screen of a power source supplier in the present invention.

A first preferred embodiment of a fixing structure for the faceplate ventilation screen of a power source supplier in the present invention, as shown in FIGS. 1-3, includes a faceplate body 10 and at least one ventilation screen 20 as main components combined together.

The faceplate body 10 rectangular-shaped is bored with two rectangular ventilation openings, having two ends respectively defined to be an upper end 12 and a lower end 13. The upper end 12 and the lower end 13 of the faceplate body 10 are respectively formed with a first extension portion 14 protruding out vertically in the same direction and located at the inner side of the faceplate body 10, and the two first extension portions 14 have their opposite inner sides respectively provided with a first position-limiting member 15 extending oppositely at a location adjacent to the faceplate body 10. The two first position-limiting members 15 are parallel to the faceplate body 10, and a reserved first gap 16 is formed between the first position-limiting members 15 and the faceplate body 10. In this preferred embodiment, the faceplate body 10, the first extension portions 14 and the first position-limiting members 15 are integrally made of aluminum squeezed in shape. The first position-limiting member 15 is a first elongated rib 151 that has a thickness less than the faceplate body 10 and can be pressed by external force to be deformed toward the faceplate body 10.

In this preferred embodiment, the faceplate body 10 of the power source supplier is provided with two ventilation screens 20 rectangular-shaped, and two ends of each ventilation screen 20 can be received in the opposite first gaps 16 to have the ventilation screen 20 correspondingly positioned at one of the rectangular ventilation openings 11.

Figure 4:
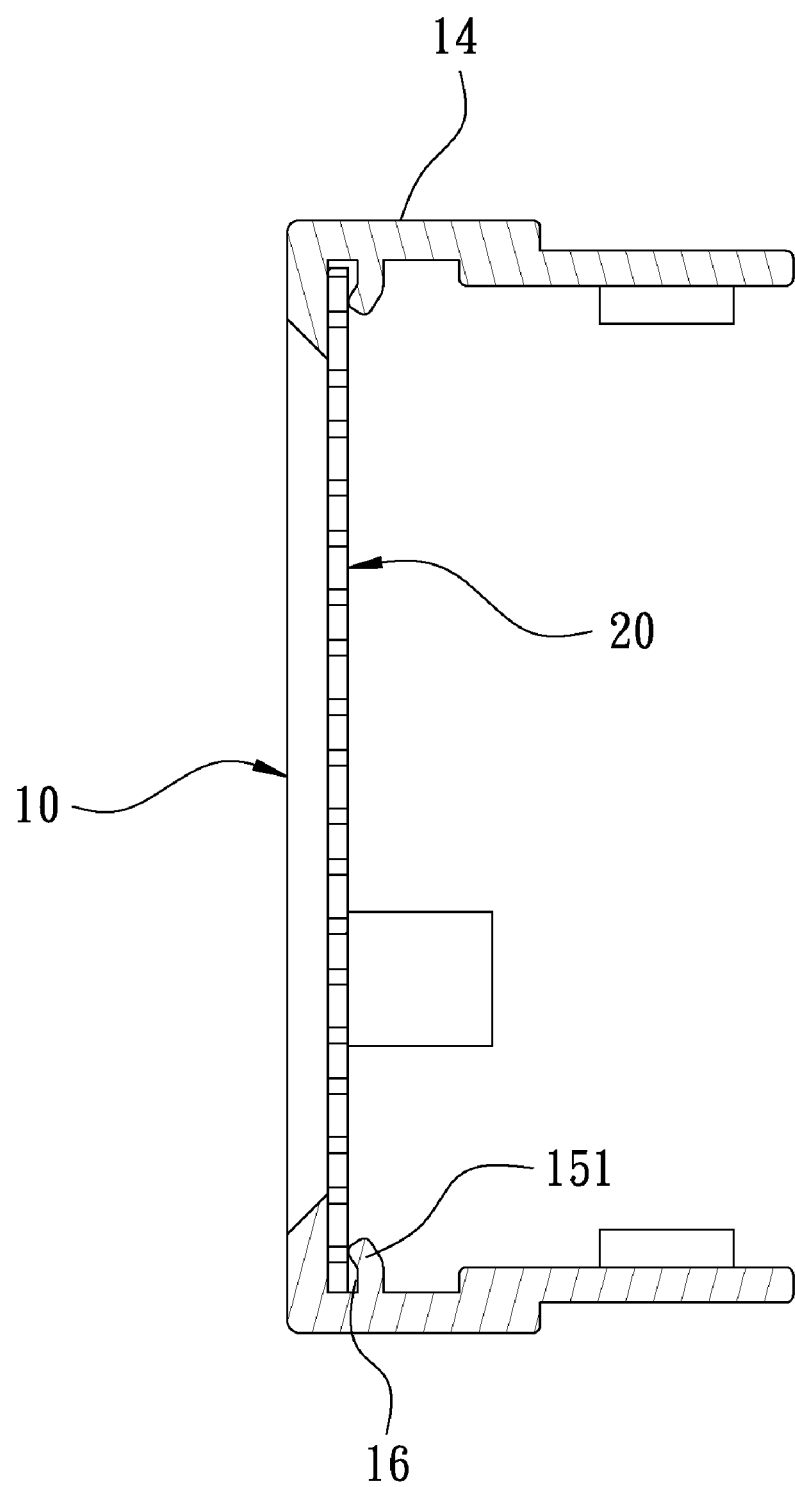
FIG. 4 is side sectional view of the first preferred embodiment of the fixing structure for the faceplate ventilation screen of a power source supplier in a using condition in the present invention.
Figure 5:
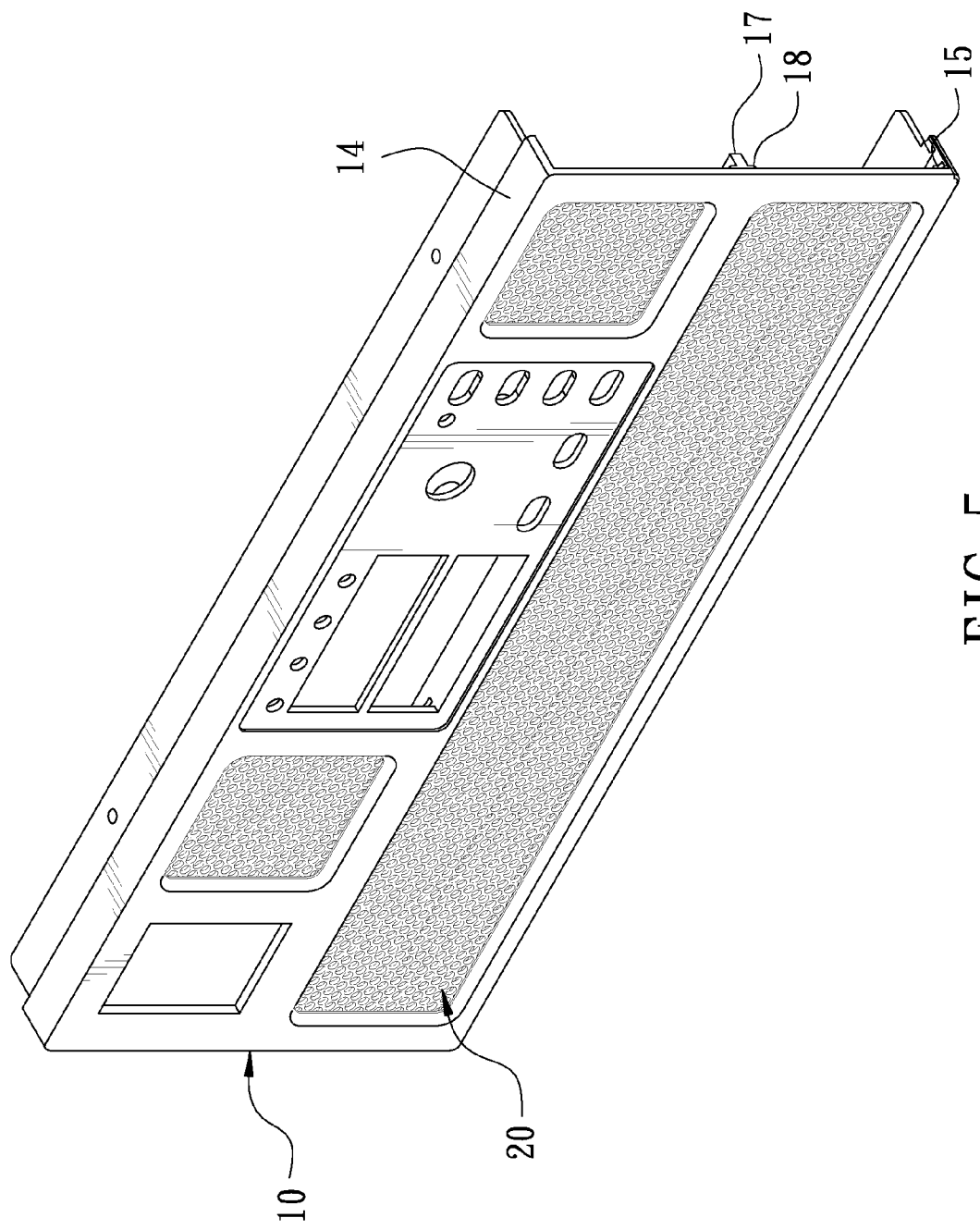
FIG. 5 is a perspective view of a second preferred embodiment of a fixing structure for the faceplate ventilation screen of a power source supplier in the present invention.
Figure 6:
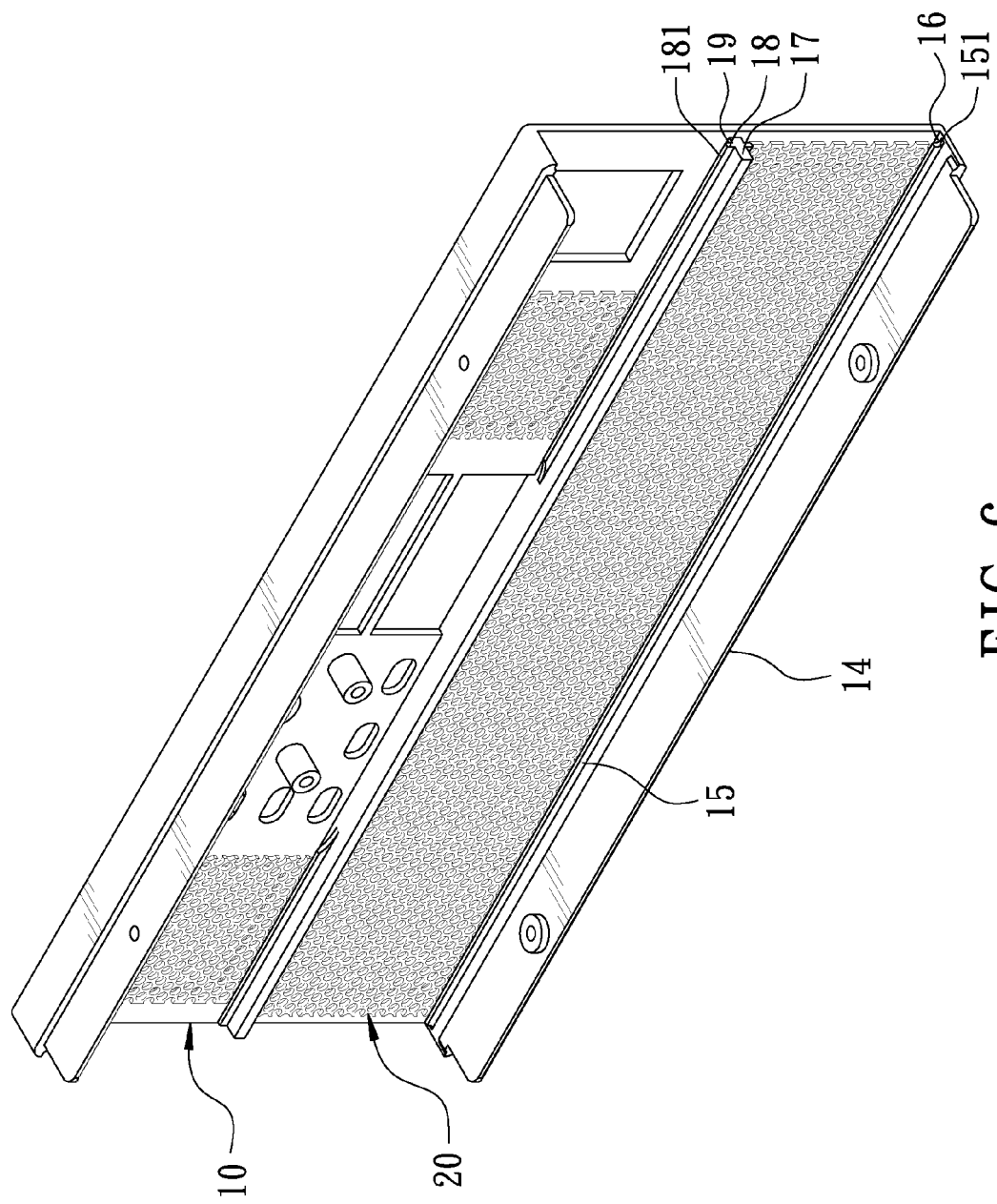
FIG. 6 is another perspective view of the second preferred embodiment of the fixing structure for the faceplate ventilation screen of a power source supplier in the present invention.
Figure 7:
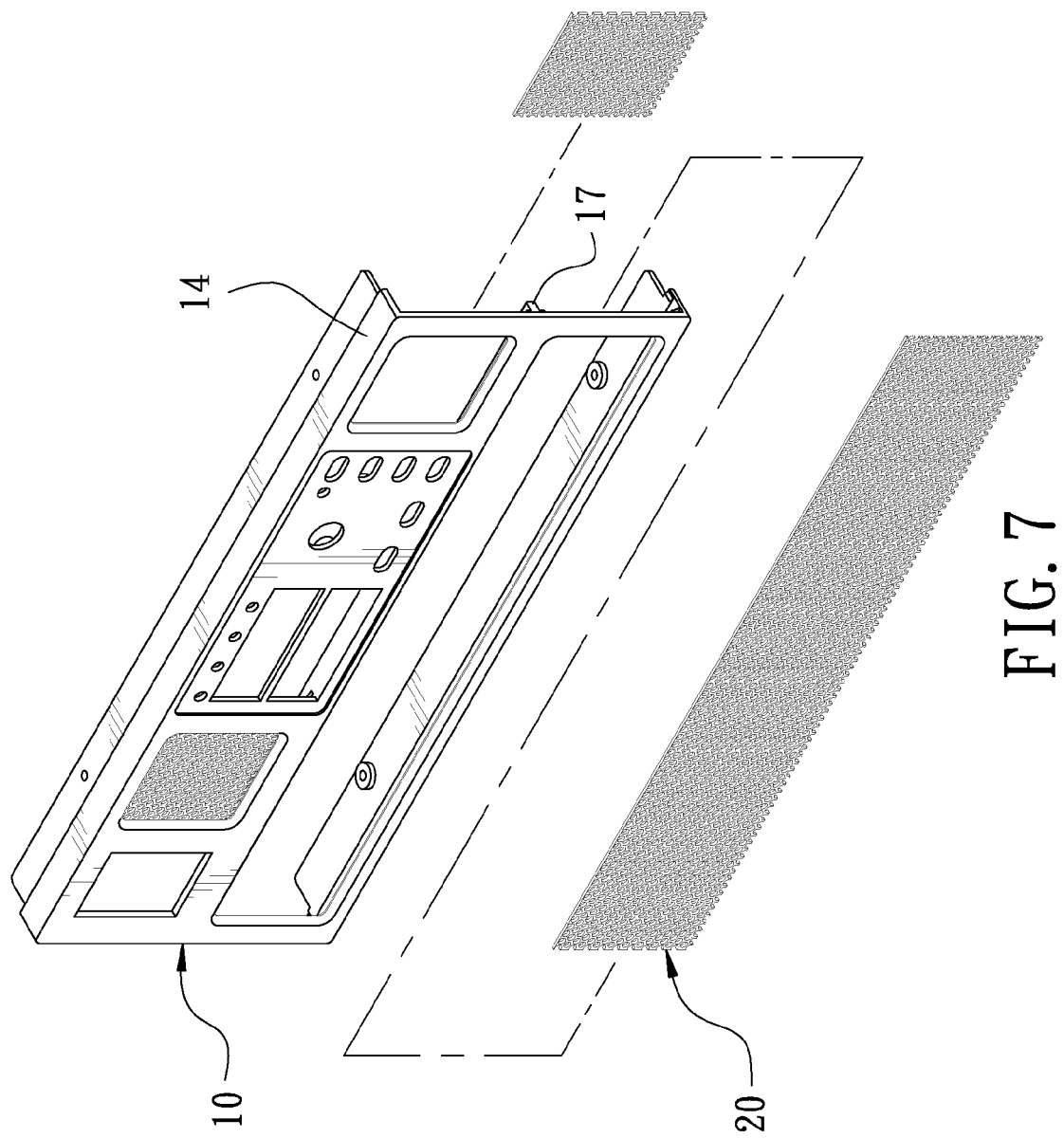
FIG. 7 is an exploded perspective view of the second preferred embodiment of the fixing structure for the faceplate ventilation screen of a power source supplier in the present invention.

In assembling, referring to FIG. 4, after the two ventilation screens 20 respectively have their opposite ends received in the first gaps 16 of the faceplate body 10, and the two ventilation screens 20 are respectively adjusted to be positioned at each of the rectangular ventilation openings 11, apply an external force to the first elongated ribs 151, which is then deformed toward the faceplate body 10 and pressed on the ventilation screens 20, thus firmly fixing the ventilation screens 20 on the faceplate body 10.

Figure 8:
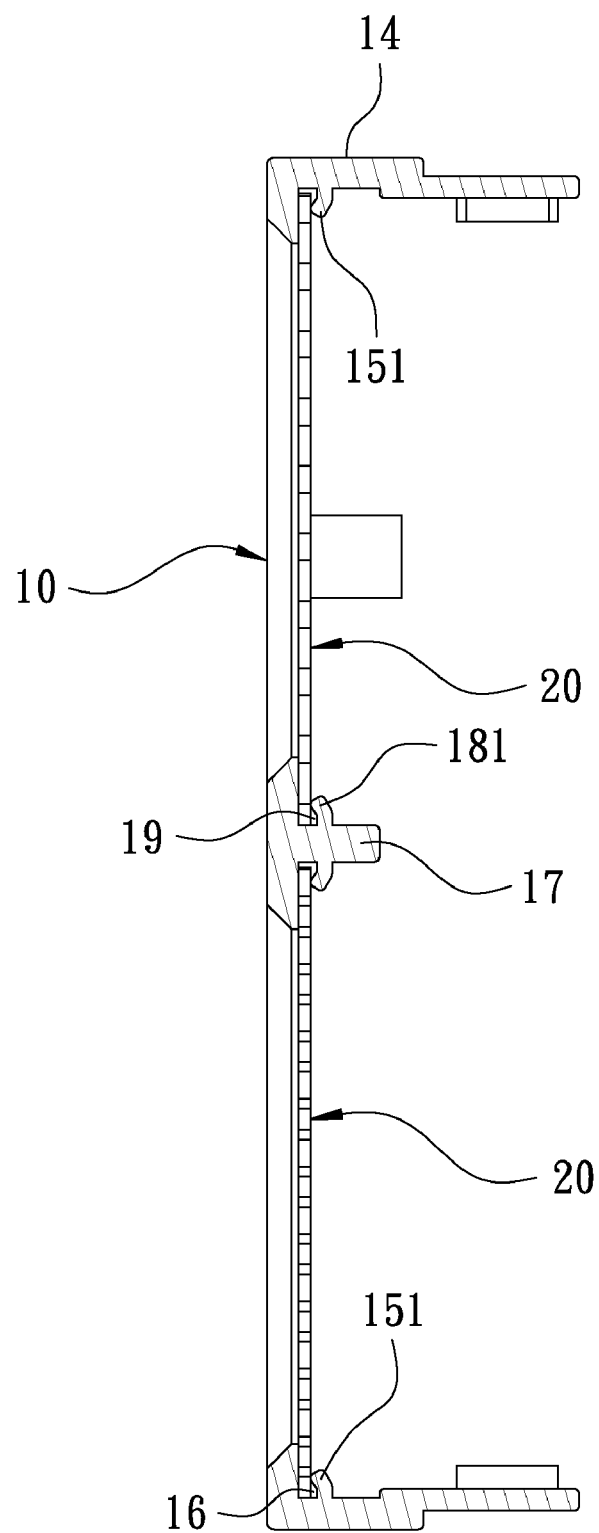
FIG. 8 is a side sectional view of the second preferred embodiment of the fixing structure for the faceplate ventilation screen of a power source supplier in a using condition in the present invention.

A second preferred embodiment of a fixing structure for the faceplate ventilating screen of a power source supplier in the present invention, as shown in FIGS. 5-8, has almost the same structure as that of the first preferred embodiment, except that the faceplate body 10 is a comparatively large-sized faceplate (a 2UH-specification faceplate) and formed additionally with a second extension portion 17 protruding out vertically between the two first extension portions 14 and located at an intermediate portion of the faceplate body 10. The second extension portion 17 has two opposite sides respectively provided with a second position-limiting member 18 protruding upward and parallel to the faceplate 10, with a reserved second gap 19 formed between the second position-limiting members 18 and the faceplate 10 for receiving two ends of a ventilation screen 20, as shown in FIG. 8. In this preferred embodiment, the second position-limiting member 18 is a second elongated rib 181 made of aluminum. After two ends of the ventilation screen 20 are respectively received in the first gap 16 and the second gap 19, the first elongated rib 151 and the second elongated rib 181 are pushed by external force to be deformed toward the faceplate body 10 and pressed on the ventilation screens 20, thus securing stably the ventilation screens 20 on the faceplate body 10.

To sum up, the fixing structure for the faceplate ventilation screen of a power source supplier of this invention is to have two ends of the ventilation screen received in the gaps formed between the faceplate body and the position-limiting members. Then, the position-limiting members are pressed by external force to be deformed toward the faceplate body and pushed on the ventilation screen to firmly fix the ventilation screen on the faceplate body, simplifying a process of assembling the ventilation screen and attaining effect of beautifying the external appearance of the power source supplier.

While the preferred embodiments of the invention have been described above, it will be recognized and understood that various modifications may be made therein and the appended claims are intended to cover all such modifications that may fall within the spirit and scope of the invention.

What is claimed is:

1. A fixing structure for a faceplate ventilation screen of a power source supplier comprising:
a faceplate body having an inner side provided with at least two first extension portions and a base, said extension portions protruding vertically in the same direction, each of said first extension portions having their opposite inner sides respectively disposed with a first position-limiting member extending oppositely from one end to another end of said faceplate body, each of said first position-limiting members parallel to said base, a plurality of first gap and second gap formed between each of said first position-limiting members and said base;
a plurality of ventilation openings in said base, a plurality of ventilation screens, each of said screens having a first end and a second end, at least one of said ventilation screens having two ends respectively received in said first gap and the second gap; and
said first position-limiting members pressed by external force to a first and a second elongated ribs to be deformed toward said faceplate body, said first position-limiting members fixing said ventilation screen on said faceplate body.

2. The fixing structure for the faceplate ventilation screen of a power source supplier as claimed in claim 1,
a second extension portion protruding out vertically is provided between said two first extension portions of said faceplate body;
said second extension portion having two opposite sides respectively formed with a second position-limiting member protruding outward and corresponding with said two first position-limiting members;
each of said second position-limiting members are parallel to said faceplate body; and
a reserved third gap formed between said second position-limiting members and said faceplate body for receiving said ventilation screens.

* * * * *